US009553123B2

(12) United States Patent
Lin et al.

(10) Patent No.: US 9,553,123 B2
(45) Date of Patent: Jan. 24, 2017

(54) BACK-ILLUMINATED SENSOR CHIPS (71) Applicant: OmniVision Technologies (Shanghai) Co., Ltd., Shanghai (CN)

(72) Inventors: Feng Lin, Shanghai (CN); Quanbao Li, Shanghai (CN); Guo Ye, Shanghai (CN)

(73) Assignee: OMNIVISION TECHNOLOGIES (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/134,184

(22) Filed: Apr. 20, 2016

(65) Prior Publication Data

US 2016/0315110 A1    Oct. 27, 2016

(30) Foreign Application Priority Data

Apr. 23, 2015    (CN) .......................... 2015 1 0197708

(51) Int. Cl.
*H01L 21/00*    (2006.01)
*H01L 27/146*    (2006.01)

(52) U.S. Cl.
CPC ....... *H01L 27/1464* (2013.01); *H01L 27/1461* (2013.01); *H01L 27/14605* (2013.01); *H01L 27/14607* (2013.01); *H01L 27/14643* (2013.01)

(58) Field of Classification Search
CPC ........... H01L 27/1464; H01L 27/14605; H01L 27/1461; H01L 27/14643
See application file for complete search history.

(56) References Cited

U.S. PATENT DOCUMENTS

| 8,400,537 | B2 * | 3/2013 | McCarten | ......... | H01L 27/14621 348/272 |
| 8,748,946 | B2 * | 6/2014 | McCarten | ......... | H01L 21/76898 257/228 |
| 2010/0201834 | A1 * | 8/2010 | Maruyama | ........ | H01L 27/14629 348/222.1 |
| 2011/0032376 | A1 * | 2/2011 | Takizawa | .......... | H01L 27/14627 348/222.1 |
| 2014/0043497 | A1 * | 2/2014 | Tanikuni | ............... | H01L 27/146 348/222.1 |
| 2014/0063303 | A1 * | 3/2014 | Masuda | ............ | H01L 27/14625 348/294 |

(Continued)

FOREIGN PATENT DOCUMENTS

JP    WO 2014156657 A1 *   10/2014   ....... H01L 27/14621

*Primary Examiner* — Laura Menz
(74) *Attorney, Agent, or Firm* — Blakely Sokoloff Taylor & Zafman LLP (57) ABSTRACT

A back-illuminated sensor chip is disclosed, which includes one or more pixel areas each including a plurality of pixels located in a plane and arranged in a matrix. Each pixel area includes: a central portion consisting of a plurality of first pixels located in vicinity of a center of the pixel area; and a peripheral portion surrounding the central portion and consisting of the other pixels in the pixel area than the first pixels. The plurality of first pixels have a first height in a vertical direction perpendicular to the plane, and the pixels in the peripheral portion have a second height in the vertical direction that is greater than the first height so that the peripheral portion protrudes outward beyond the central portion and is thus located nearer to a light source during imaging than the central portion. As a result, light sensibility of the peripheral portion is increased.

6 Claims, 6 Drawing Sheets

(56) References Cited

U.S. PATENT DOCUMENTS

| | | | | |
|---|---|---|---|---|
| 2014/0333719 A1* | 11/2014 | Williams | ........... | H01L 27/14625 |
| | | | | 348/36 |
| 2015/0130006 A1* | 5/2015 | Uehira | ............. | H01L 27/14627 |
| | | | | 257/432 |
| 2016/0182843 A1* | 6/2016 | Endo | ....................... | H04N 5/217 |
| | | | | 348/294 |

* cited by examiner

BACK-ILLUMINATED SENSOR CHIPS

CROSS-REFERENCES TO RELATED APPLICATIONS

This application claims the priority of Chinese patent application number 201510197708.5, filed on Apr. 23, 2015, the entire contents of which are incorporated herein by reference.

TECHNICAL FIELD

The present invention relates to integrated circuit (IC) fabrication and, in particular, to back-illuminated sensor chips.

BACKGROUND

Cameras are one of the major applications of image sensors. A camera is essentially consisted of an image sensor and a proper lens. Focusing of a conventional camera lens is typically associated with the problem of non-uniformity in imaging characteristic between a central area and a peripheral area of the lens. As a result, an image captured by such a lens generally has a lower quality in its peripheral area than in its central area in terms of, e.g., clarity and brightness. This phenomenon depends on the nature of the lens and is thus hard to be improved through lens modifications.

In order to solve the above-described non-uniform imaging quality problem, Sony Corporation has proposed the use of an arc-shaped silicon substrate for image sensor chip. This arc-shaped configuration imitates the principles of physics in optical imaging of the human eye, in which the lens is equidistant from each photodiode in the image sensor, thereby allowing comparable imaging qualities of peripheral and central areas of the lens. Although this is theoretically capable of solving the non-uniform imaging problem of the conventional devices, formation of the arc-shaped silicon substrate can introduce additional stress to the chip, which has the following two possible consequences: 1) cracking of the chip; and 2) a certain degree of deterioration of imaging quality, particularly in terms of, for example, dark current, white pixel and noise. Avoidance of these risks may impose extremely strict requirements on the production process and thus lead to a significant reduction in the yield.

Therefore, how to mitigate the aforementioned drawbacks of the conventional cameras is one of the major issues to be addressed by those skilled in the art.

SUMMARY OF THE INVENTION

It is an objective of the present invention to provide a back-illuminated sensor chip which can solve the aforementioned problem of lens-caused non-uniform imaging quality arising from use of the conventional cameras.

In order to solve the foregoing problem, the present invention provides a back-illuminated sensor chip, including one or more pixel areas each comprising a plurality of first pixels and a plurality of second pixels located in a plane and arranged in a matrix, wherein each of the one or more pixel areas further includes: a central portion consisting of the plurality of first pixels located in vicinity of a center of the pixel area; and a peripheral portion surrounding the central portion and consisting of the plurality of second pixels in the pixel area, wherein: the plurality of first pixels in the central portion have a first height in a vertical direction perpendicular to the plane; the plurality of second pixels in the peripheral portion have a second height in the vertical direction; and the second height is greater than the first height so that the peripheral portion protrudes outward beyond the central portion.

Optionally, the central portion may have a rectangular shape, and the peripheral portion may have a substantially annular shape.

Optionally, the second height may be 10-200 μm greater than the first height.

Optionally, the peripheral portion may have a first ion concentration and the central portion may have a second ion concentration lower than the first ion concentration.

Optionally, the central portion may further include: a first portion, centrally situated in the central portion; and a second portion surrounding the first portion and protruding outward beyond the first portion.

Optionally, the plurality of second pixels in the peripheral portion may be 10-200 μm higher than a plurality of third pixels in the second portion, and the plurality of third pixels in the second portion may be 5-160 μm higher than a plurality of fourth pixels in the first portion.

Optionally, the peripheral portion may have a first ion concentration; the second portion may have a third ion concentration; the first portion may have a fourth ion concentration; the first ion concentration may be higher than the third ion concentration; and the third ion concentration may be higher than the fourth ion concentration.

Optionally, the chip may have a thickness of 700 μm to 900 μm.

A back-illuminated sensor chip according to the present invention includes a logic area and a pixel area. The pixel area includes a peripheral portion and a central portion surrounded by the peripheral portion. The peripheral and central portions together form a step-like configuration with the peripheral portion protruding outward beyond the central portion. Therefore, the peripheral portion of the pixel area is located nearer to a light source during imaging. As a result, in light incident on the back-illuminated sensor chip, a portion of the light received by the peripheral portion is greater than a portion received by the central portion, thereby resulting in increased light sensibility of the peripheral portion, which can offset lens-caused non-uniformity in imaging characteristics between central and peripheral areas of a camera in which the sensor chip is used, i.e., resulting in more uniform imaging quality of the camera.

DETAILED DESCRIPTION

Back-illuminated sensor chips, as well as their fabrication methods, according to the present invention are described blow in further detail with reference to a few embodiments and the drawings pertaining thereto. Features and advantages of the invention will become more apparent from the following detailed description, as well as from the appended claims. Note that the drawings are presented in a very simplified form not necessarily drawn to scale, with the only intention of facilitating convenience and clarity in explaining the embodiments.

Embodiment 1

Referring to FIGS. 1a to 1e, which are cross-sectional views illustrating the formation of a pixel area in the construction of a back-illuminated sensor chip in a fabrication method of the back-illuminated sensor chip according to a first embodiment of the present invention.

Figure 1A:
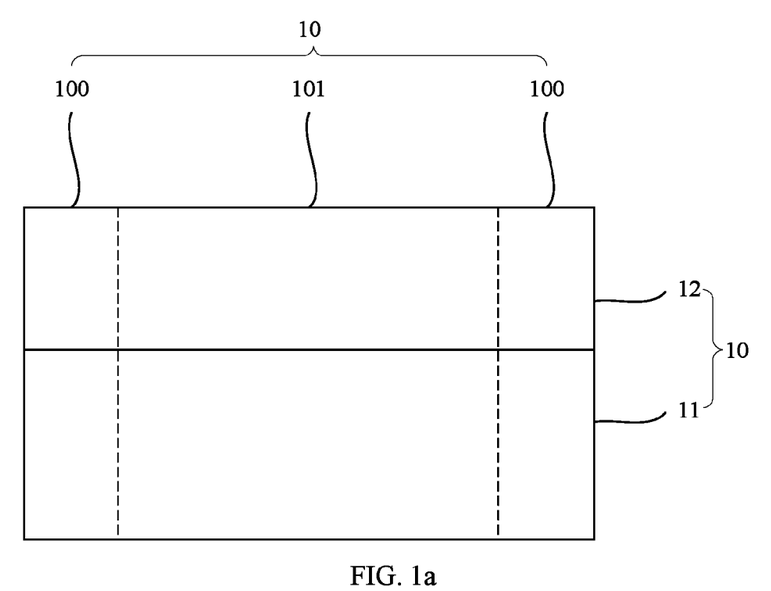
FIGS. 1a to 1e are cross-sectional views illustrating the formation of a pixel area in the construction of a back-illuminated sensor chip in a fabrication method of the back-illuminated sensor chip according to a first embodiment of the present invention.

At first, a composite substrate consisting of a device wafer and a carrier wafer (bonded together) is provided and the backside of the device wafer is thinned. The composite substrate includes a plurality of chip dies each having a pixel area and a logic area surrounding the pixel area. FIG. 1a shows a pixel area 10 of one of the chip dies, which includes a portion of the device wafer 12 and a portion of the carrier wafer 11. Further, as shown in FIG. 1a, the pixel area 10 includes a peripheral portion 100 and a central portion 101 surrounded by the peripheral portion 100. According to embodiments disclosed herein, the composite substrate may be silicon or silicon-germanium, and so forth. Preferably, the composite substrate has a thickness ranging from 700 μm to 900 μm, and a thickness of 20 μm to 200 μm of the composite substrate (the device wafer) is removed in the thinning process. FIG. 1a shows a pixel area 10 after the thinning process, or, in other words, FIG. 1a shows a pixel area 10 in a chip die of the thinned composite substrate.

Figure 2A:
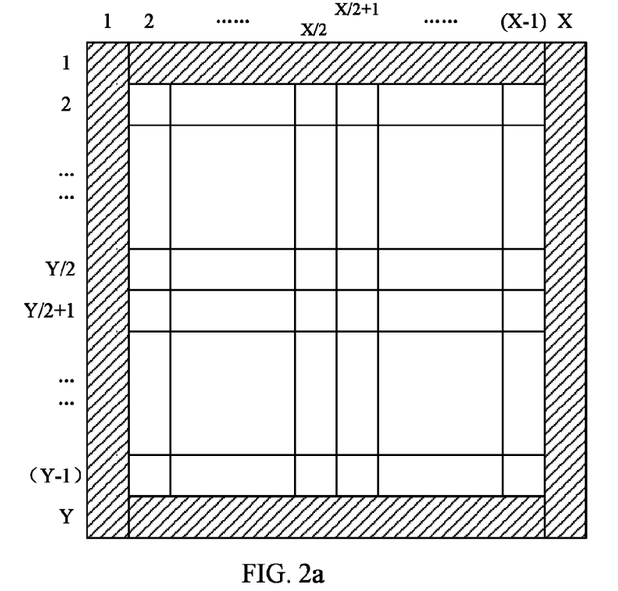
FIGS. 2a to 2b are schematic illustrations of embodiments of peripheral and central portions of a pixel area of a chip die used in the fabrication method of the back-illuminated sensor chip according to the first embodiment of the present invention.
Figure 2B:
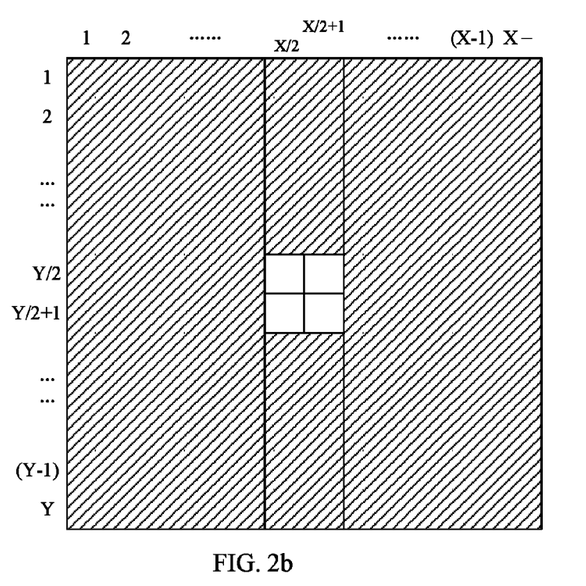

According to embodiments disclosed herein, the pixel area 10 includes a plurality of pixels located in a plane and arranged in a matrix. The central portion 101 of the pixel area 10 is a substantially square or rectangular region consisting of a plurality of pixels disposed in vicinity of a center of the pixel area 10 and including at least one or more central pixels in the pixel area 10. The peripheral portion 100 is the other portion of pixel area 10 than the central portion 101. The peripheral portion 100 has a substantially annular configuration and includes at least the outermost pixels in the pixel area 10. Further description is presented below with reference to FIGS. 2a and 2b. Here, assuming the pixel area 10 has X columns and Y rows of pixels, where X and Y are both even numbers, then in the case of the peripheral portion 100 occupying a minimum area, i.e., as indicated by the shaded portion in FIG. 2a, having only the outermost pixels, the central portion 101, i.e., the other portion of the pixel area 10 than that of the outermost pixels, occupies a maximum area. In the case of the peripheral portion 100 occupying a maximum area, i.e., as indicated by the shaded portion in FIG. 2b, having all the other pixels in the pixel area 10 than the four central pixels, the central portion 101 occupies a minimum area, i.e., having only the four central pixels. On this basis, areas that can be occupied by the peripheral portion 100 and central portion 101 can be easily estimated for the case that X is an odd number and Y is an even number, and for the case that X is an even number and Y is an odd number, and for the case that X and Y are both odd numbers.

Figure 1B:
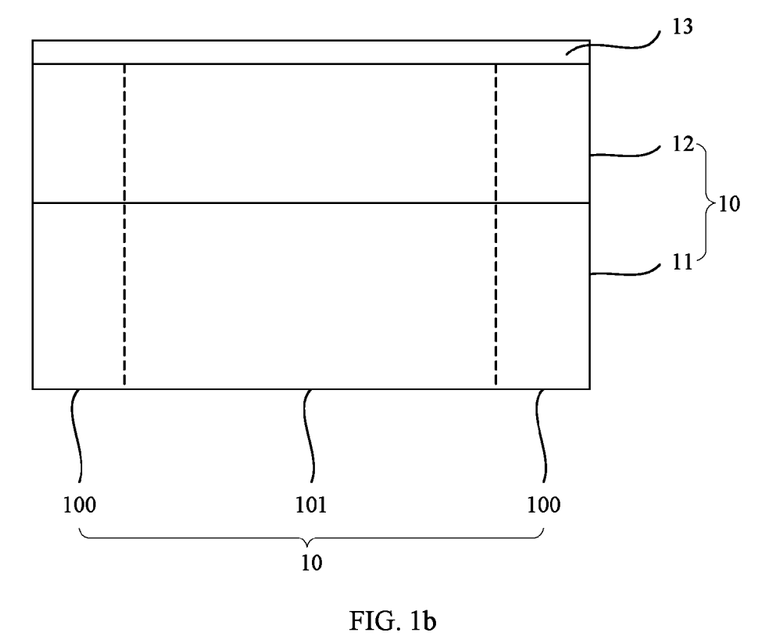

Next, as shown in FIG. 1b, according to embodiments disclosed herein, a first silicon oxide layer 13 is formed on top of the thinned device wafer 12 (i.e., over the backside of the thinned device wafer 12). Specifically, a chemical vapor deposition (CVD) technique can be employed to form the first silicon oxide layer 13 on the device wafer 12. The formation of the first silicon oxide layer 13 on the device wafer 12 can facilitate the removal of a photoresist to be coated on the pixel area 10 (i.e., on the device wafer 12) in a subsequent process after the pixel area 10 has been etched.

Figure 1C:
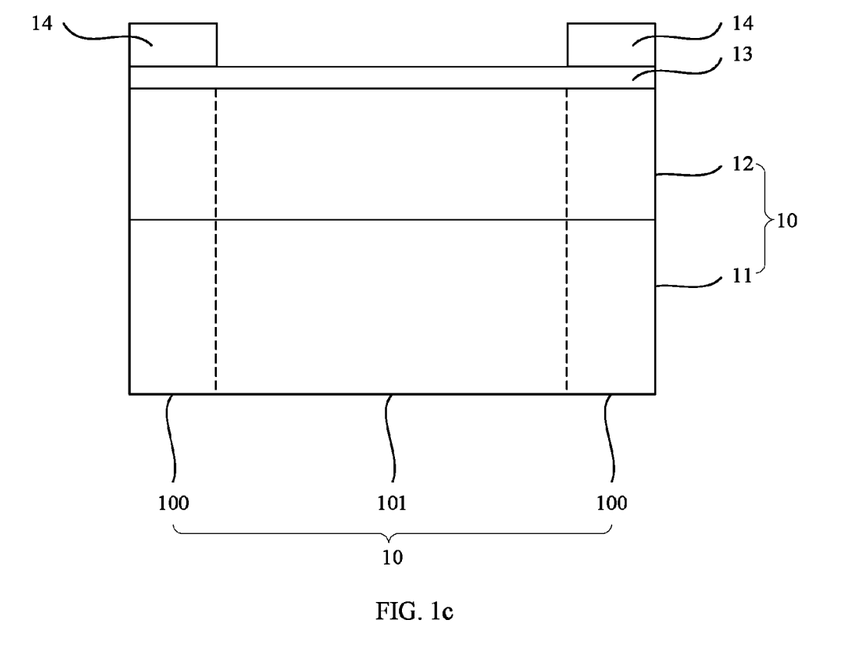

After that, according to embodiments disclosed herein, as shown in FIG. 1c, a first photoresist layer 14 is formed on a portion of the first silicon oxide layer 13 that corresponds to the peripheral portion 100. Herein, the first photoresist layer 14 is a patterned photoresist layer, i.e., covering only the portion of the first silicon oxide layer 13.

Figure 1D:
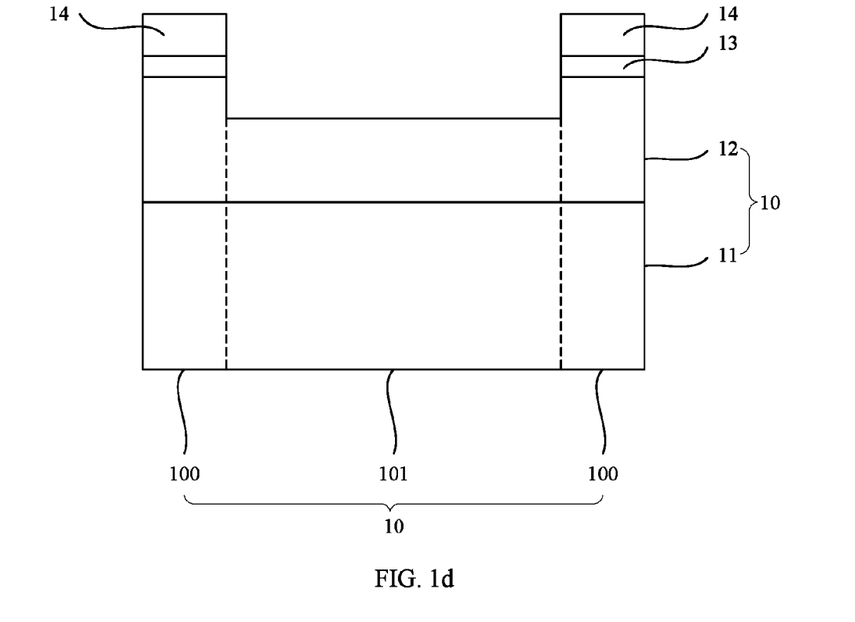

Afterward, as shown in FIG. 1d, a portion of the first silicon oxide layer 13 above the central portion 101 is removed, and the central portion 101 is partially etched such that the peripheral portion 100 and the etched central portion 101 together form a step-like configuration with the peripheral portion 100 having a height greater than a height of the central portion 101.

Specifically, a wet etching process may be first performed to etch away the portion of the first silicon oxide layer 13 above the central portion 101. Preferably, this wet etching process uses a hydrofluoric acid (HF) solution.

With the portion of the first silicon oxide layer 13 above the central portion 101 having been etched away, a second wet etching process may be performed to etch the pixel area 10 (specifically the central portion 101). Preferably, a HF solution mixed with nitric acid ($HNO_3$) may be used to etch the central portion 101. Further, a desired etching depth of the central portion 101 may be achieved by selecting proper etching time and/or proper concentration of the $HF/HNO_3$ mixture. Its further description is omitted herein. Preferably, after this etching process, the peripheral portion 100 is 10-200 μm higher than the central portion 101.

As the peripheral portion 100 becomes higher than the central portion 101 after the above process, the peripheral portion 100 is located nearer to a light source during imaging than the central portion 101. As a result, in light incident on the resulting back-illuminated sensor chip, a portion of the light received by the peripheral portion 100 is greater than that received by the central portion 101. That is, the peripheral portion 100 has relatively increased light sensibility, which can offset lens-caused non-uniformity in imaging characteristics between central and peripheral areas of a camera in which the sensor chip is incorporated, i.e., resulting in more uniform imaging quality of the camera.

According to embodiments disclosed herein, after the central portion 101 has been etched, the first photoresist layer 14 (reference can be made accordingly to FIG. 1e), as well as the underlying remainder of the first silicon oxide layer 13, may be completely removed.

Figure 1E:
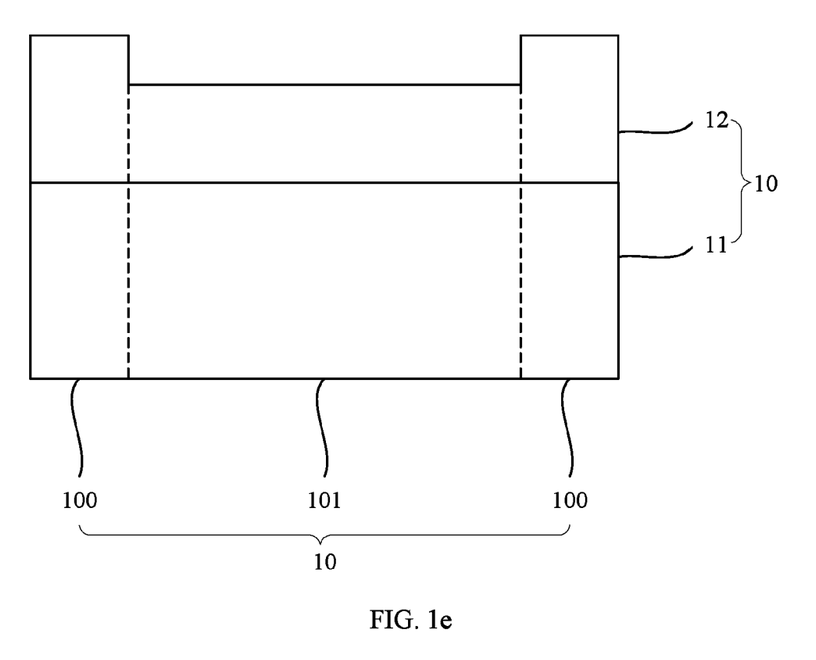

A plurality of the back-illuminated sensor chips can be fabricated in one pass using the same process and then cut into individual sensor chips each including a logic area (not shown) and a pixel area 10. The pixel area 10 includes a peripheral portion 100 and a central portion 101 surrounded by the peripheral portion 100. The peripheral portion 100 and central portion 101 together form a step-like configuration with the peripheral portion 100 protruding outward beyond the central portion 101.

Embodiment 2

This embodiment differs from Embodiment 1 in that a concentration of ions implanted in the peripheral portion 100 is higher than a concentration of ions implanted in the central portion 101. Here, reference may be made to FIG. 1e.

Specifically, a back-illuminated sensor chip according to this embodiment includes a logic area (not shown) and a pixel area 10. The pixel area 10 includes a peripheral portion 100 and a central portion 101 surrounded by the peripheral portion 100. The peripheral portion 100 and central portion 101 together form a step-like configuration with the peripheral portion 100 protruding outward beyond the central portion 101. In addition, a concentration of ions implanted in the peripheral portion 100 is higher than a concentration of ions implanted in the central portion 101.

More specifically, according to embodiments disclosed herein, during the manufacture of the device wafer 12 (i.e., before the backside of the device wafer 12 is thinned), multiple doses of ions, i.e., with one or more doses in addition to the commonly used dose, may be implanted in the peripheral portion 100, such that the peripheral portion 100 has a higher ion concentration than the central portion 101. In addition, the implantation of the additional ion doses may be carried out during an ion implantation process for forming n-wells in the device wafer 12. More specifically, the implantation of the additional doses into the peripheral portion 100 may be accomplished by using pre-defined photoresist patterns. That is, before the composite substrate is provided, peripheral portion 100 has already had a higher ion concentration than the central portion 101, which can eliminate the need for additional processes employed in the conventional techniques and thus result in reduced cost.

Alternatively, according to embodiments disclosed herein, the ion implantation of the peripheral portion 100 may be performed after the removal of the first photoresist layer 14, so as to make the peripheral portion 100 have a higher ion concentration than the central portion 101.

According to embodiments disclosed herein, a higher ion concentration of the peripheral portion 100 than the central portion 101 can result in an improvement in light sensitivity of the peripheral portion 100, thereby offsetting lens-caused non-uniformity in imaging characteristics between central and peripheral areas of a camera in which the sensor chip is incorporated, i.e., resulting in more uniform imaging quality of the camera.

In other words, according to embodiments disclosed herein, the light sensitivity of the peripheral portion 100 can be increased under the combined effect of the following two factors:

1) a greater height of the peripheral portion 100 than the central portion 101; and 2) a higher ion concentration of the peripheral portion 100 than the central portion 101.

As the mechanism of factor 1) has been explained in the description of Embodiment 1, further description thereof is omitted here. The following paragraphs are provided in order to describe the mechanism of factor 2).

A pixel's capacity of collecting charges in its potential well is referred to as its well capacity, and full well capacity is one of the main parameters for measuring the imaging quality of a back-illuminated sensor chip. Theoretically, the full well capacity of a sensor die is determined by a concentration of ions implanted therein, but actual measurements of the full well capacity depend also on practical lighting conditions. This parameter of full well capacity indirectly reflects the light sensitivity, i.e., the ability to produce photoelectrons, of a back-illuminated sensor chip.

In existing cameras using conventional back-illuminated sensor chips (i.e., as well known, sensor chips having a flat surface and a uniform ion concentration throughout its various portions, or stated with the terms used herein, having equally high peripheral and central portions in the pixel area which are doped with the same concentration of ions), the peripheral and central portions are subject to different lighting conditions due to the presence of lenses, which typically make the peripheral portion actually insufficiently illuminated and thus incapable of producing photoelectrons in a maximum number corresponding to the theoretical full well capacity. On the contrary, the central portion is typically subject to the optimum lighting condition and thus has an actual production of photoelectrons in the number corresponding to the theoretical full well capacity. As a result, there are differences, typically of up to 5-20%, between measurements of the actual full well capacity in the central portion and measurements of the actual full well capacity in the peripheral portion. For this reason, the existing cameras suffer from non-uniform imaging characteristics between the central and peripheral portions.

Whereas, according to embodiments disclosed herein, a higher ion concentration of the peripheral portion 100 in the pixel area than the central portion 101 can result in an increased theoretical full well capacity of the peripheral portion 100, which compensates for the incapability of the peripheral portion 100 of achieving the best lighting condition and hence offsets lens-caused non-uniformity in imaging characteristics between central and peripheral areas of the cameras, i.e., resulting in more uniform imaging quality of the cameras. Further, the reduced non-uniformity in imaging characteristics between the central and peripheral areas of the camera, i.e., an increased imaging quality uniformity of the camera, resulting from a greater higher of the peripheral portion 100 than the central portion 101, as described in Embodiment 1, can be explained either from the viewpoint of a nearer location of the peripheral portion 100 to the light source, which allows the peripheral portion 100 to receive a greater portion of light than the central portion, or from the viewpoint of an increased theoretical full well capacity of the peripheral portion 100.

Embodiment 3

This embodiment differs from Embodiment 1 in that the central portion 101 of the pixel area 10 is further partitioned into a first portion 103 centrally situated in the central portion 101 and a second portion 102 surrounding the first portion 103. The second portion 102 and the first portion 103 together form a step-like configuration, in which the second portion 102 has a height greater than a height of the first portion 103. In other words, compared to Embodiment 1, the pixel area 10 according to this embodiment has a finer configuration which can fit better with a corresponding lens to form a camera with more uniform imaging characteristics.

This embodiment can be implemented by carrying out the steps illustrated in FIGS. 3a to 3d, in addition to those shown in FIGS. 1a to 1d (i.e., the step shown in FIG. 1e is not performed in this embodiment), which are also referenced in the description of Embodiment 1.

Figure 3A:
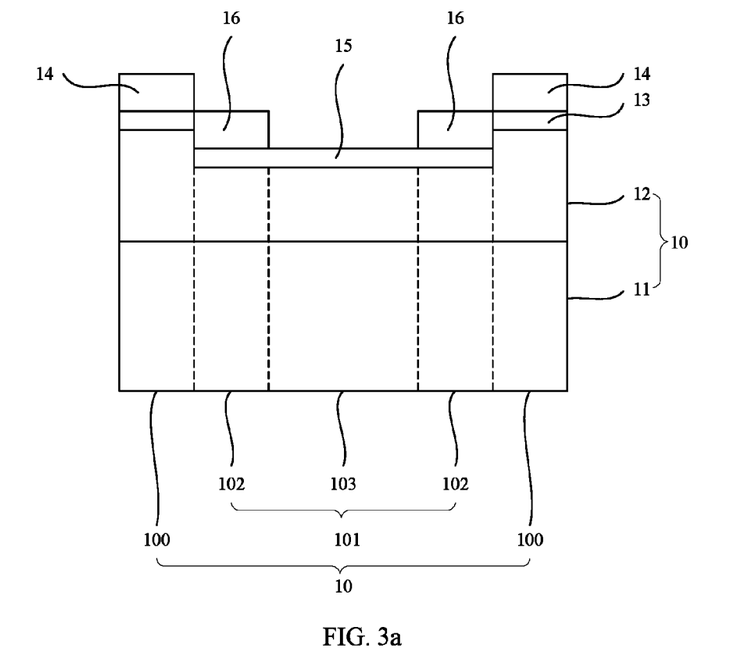
FIGS. 3a to 3d are cross-sectional views illustrating the formation of a pixel area in the construction of a back-illuminated sensor chip in a fabrication method of the back-illuminated sensor chip according to a third embodiment of the present invention.

In other words, after the step shown in FIG. 1d has been completed, with additional reference to FIG. 3a, a second silicon oxide layer 15 is formed over the etched central portion 101, wherein the central portion 101 includes the first portion 103 and the second portion 102 surrounding the first portion 103.

Figure 3B:
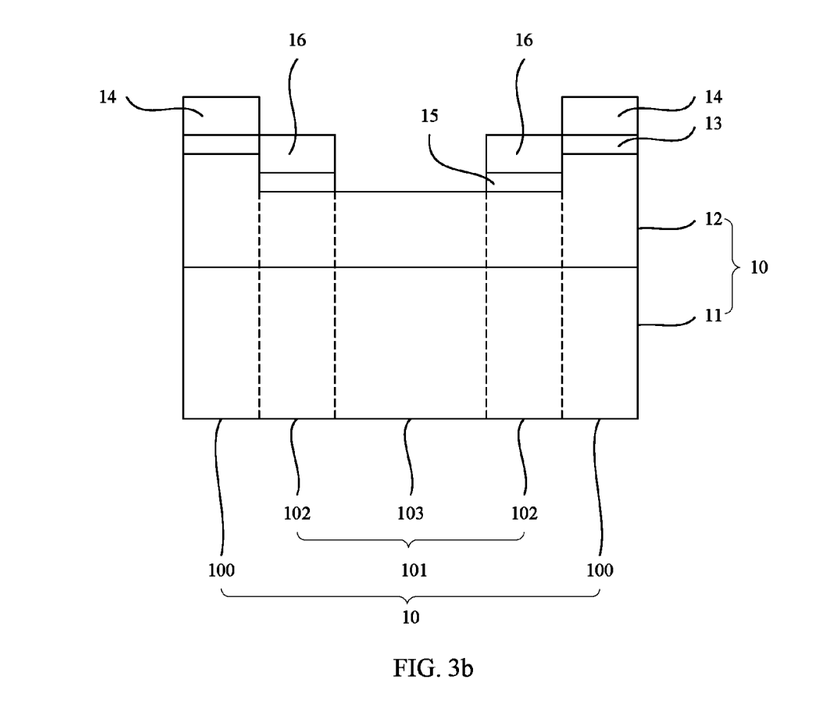

After that, as shown in FIG. 3b, a second photoresist layer 16 is formed on a portion of the second silicon oxide layer 15 corresponding to the second portion 102. That is, the second photoresist layer 16 here is also a patterned photoresist which covers only the second portion 102.

Figure 3C:
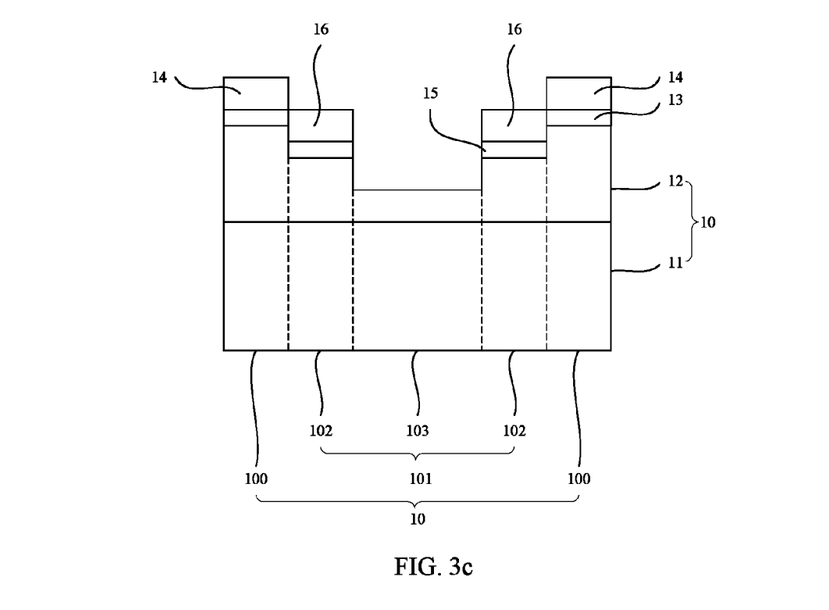

Subsequently, as shown in FIG. 3c, a portion of the second silicon oxide layer 15 over the first portion 103 is removed and the first portion 103 is partially etched, such that the second portion 102 and the etched first portion 103 together form a step-like configuration, with the second portion 102 protruding beyond the first portion 103.

Specifically, a wet etching process may be first performed to etch away the portion of the second silicon oxide layer 15 covering the first portion 103. Preferably, the wet etching process uses a HF solution.

With the portion of the second silicon oxide layer 15 covering the first portion 103 having been removed, a second wet etching process may be performed to etch the first portion 103 in the pixel area 10. Preferably, a HF solution mixed with $HNO_3$ is used to etch the first portion 103. Further, a desired etching depth of the first portion 103 may be achieved by selecting proper etching time and/or proper concentration of the $HF/HNO_3$ mixture, and its further description is omitted herein. Preferably, after this etching process, the second portion 102 is 5-160 μm higher than the first portion 103.

As such, after the process, in the pixel area, the peripheral portion 100 protrudes beyond the central portion 101, and in the central portion 101, the second portion 102 is higher than the first portion 103. During imaging, the peripheral portion 100 is therefore located nearer to a light source than the second portion 102, and the second portion 102 is in turn located nearer to the light source than the first portion 103. As a result, in light incident on the resulting back-illuminated sensor chip, a portion of the light received by the peripheral portion 100 is greater than that received by the second portion 102, and the portion of the light received by second portion 102 is greater than that received by the first portion 103. That is, the peripheral portion 100 has an increased light sensibility, and the second portion 102 also has an increased light sensibility. This can better offset lens-caused non-uniformity in imaging characteristics between central and peripheral areas of a camera in which the sensor chip is incorporated, i.e., resulting in even more uniform imaging quality of the camera.

Figure 3D:
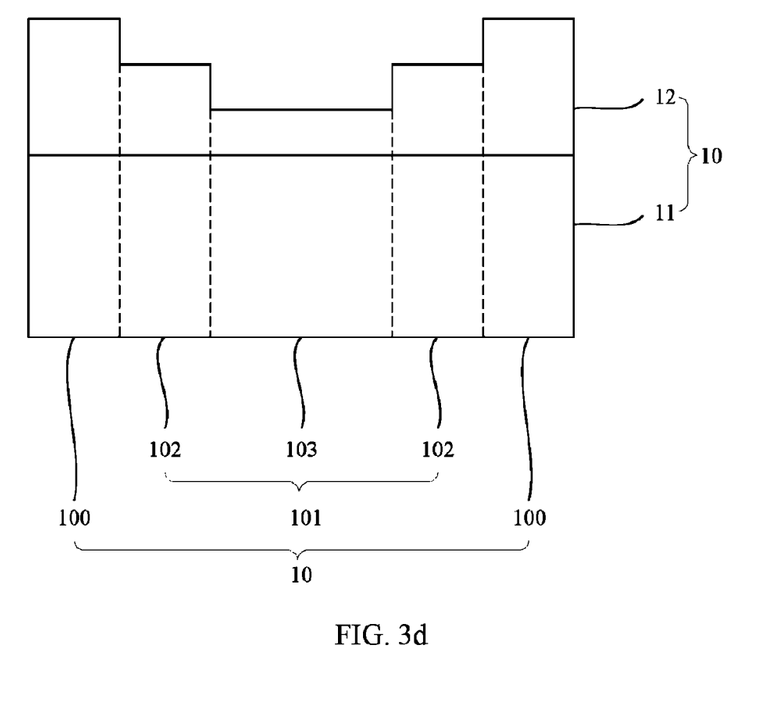

According to embodiments disclosed herein, after the first portion 103 has been etched, the first photoresist layer 14 and the underlying remainder of first silicon oxide layer 13, as well as the second photoresist layer 16 and the underlying remainder of the second silicon oxide layer 15 may be removed.

Further, according to embodiments disclosed herein, ion implantations may be performed such that an ion concentration in the second portion 102 is higher than an ion concentration in the first portion 103, and that the ion concentration in the second portion 102 is lower than an ion concentration in the peripheral portion 100. This can provide additional offset for the lens-caused non-uniformity in imaging characteristics between central and peripheral areas of the camera and thus enables still even more uniform imaging quality of the camera.

The foregoing description is provided merely for the purpose of illustrating some preferred embodiments of the present invention and is not intended to limit the scope thereof in any way. Any changes and modifications made by those of ordinary skill in the art in light of the above teachings fall within the protection scope defined by the appended claims.

What is claimed is:

1. A back-illuminated sensor chip, comprising one or more pixel areas each comprising a plurality of first pixels and a plurality of second pixels located in a plane and arranged in a matrix, wherein each of the one or more pixel areas further comprises:
  a central portion consisting of the plurality of first pixels located in vicinity of a center of the pixel area; and
  a peripheral portion surrounding the central portion and consisting of the plurality of second pixels in the pixel area,
  wherein: the plurality of first pixels in the central portion have a first height in a vertical direction perpendicular to the plane; the plurality of second pixels in the peripheral portion have a second height in the vertical direction; and
  the second height is greater than the first height so that the peripheral portion protrudes outward beyond the central portion,
  wherein: the central portion further comprises:
  a first portion, centrally situated in the central portion;
  a second portion, surrounding the first portion and protruding outward beyond the first portion;
  wherein the peripheral portion has a first ion concentration;
  the second portion has a third ion concentration;
  the first portion has a fourth ion concentration;
  the first ion concentration is higher than the third ion concentration; and
  the third ion concentration is higher than the fourth ion concentration.

2. The back-illuminated sensor chip of claim 1, wherein the central portion has a rectangular shape and the peripheral portion has a substantially annular shape.

3. The back-illuminated sensor chip of claim 1, wherein the second height is 10-200 μm greater than the first height.

4. The back-illuminated sensor chip of claim 1, wherein the peripheral portion has a first ion concentration and the central portion has a second ion concentration lower than the first ion concentration.

5. The back-illuminated sensor chip of claim 1, wherein the plurality of second pixels in the peripheral portion are 10-200 μm higher than a plurality of third pixels in the second portion, and the plurality of third pixels in the second portion are 5-160 μm higher than a plurality of fourth pixels in the first portion.

6. The back-illuminated sensor chip of claim 1, wherein the back-illuminated sensor chip has a thickness of 700 μm to 900 μm.

* * * * *